United States Patent [19]

Feldstein

[11] 4,339,476

[45] * Jul. 13, 1982

[54] DISPERSIONS FOR ACTIVATING NON-CONDUCTORS FOR ELECTROLESS PLATING

[76] Inventor: Nathan Feldstein, 63 Hemlock Cir., Princeton, N.J. 08540

[ * ] Notice: The portion of the term of this patent subsequent to Dec. 26, 1995, has been disclaimed.

[21] Appl. No.: 182,124

[22] Filed: Aug. 28, 1980

Related U.S. Application Data

[60] Division of Ser. No. 934,344, Aug. 17, 1978, Pat. No. 4,220,678, which is a division of Ser. No. 830,456, Sep. 6, 1977, abandoned, which is a continuation-in-part of Ser. No. 731,212, Oct. 12, 1976, Pat. No. 4,136,216, which is a division of Ser. No. 607,506, Aug. 26, 1975, Pat. No. 3,993,799, which is a continuation-in-part of Ser. No. 512,224, Oct. 4, 1974, abandoned.

[51] Int. Cl.³ ............................................. C23C 3/02
[52] U.S. Cl. .................................... 427/98; 106/1.11; 427/305; 427/306; 427/307
[58] Field of Search ................. 427/304, 307, 305, 98, 427/306; 106/1.11

[56] References Cited

U.S. PATENT DOCUMENTS

| | | | |
|---|---|---|---|
| 3,011,920 | 12/1961 | Shipley | 427/304 |
| 3,500,927 | 3/1970 | Simpson | 427/305 |
| 3,532,518 | 10/1970 | D'Ottavio | 427/304 |
| 3,657,003 | 4/1972 | Kenney | 427/430.1 |
| 3,958,048 | 5/1976 | Donovan et al. | 427/304 |
| 3,993,799 | 11/1976 | Feldstein | 427/304 |
| 4,131,699 | 12/1978 | Feldstein | 427/306 |
| 4,282,271 | 8/1981 | Feldstein | 427/98 |

FOREIGN PATENT DOCUMENTS 1426462 of 0000 United Kingdom .

OTHER PUBLICATIONS

Weiser, "Inorganic Colloid Chemistry", vol. 1, p. 137.

Primary Examiner—Ralph S. Kendall

[57] ABSTRACT

Metallic surfaces are imparted to non-conductive or dielectric substrates by an electroless (chemical) coating process comprised of coating the surface of the substrate with colloids of catalytic non-precious metals wherein the metals are either part of an alloy or in the elemental state or a compound and wherein the colloidal suspension further comprises antioxidant as to minimize the surface oxidation of the colloids and are further admixed in a manner resulting in good colloidal stability.

27 Claims, No Drawings

DISPERSIONS FOR ACTIVATING NON-CONDUCTORS FOR ELECTROLESS PLATING

REFERENCE TO PRIOR APPLICATION

This is a division of application Ser. No. 934,344 filed Aug. 17, 1978, U.S. Pat. No. 4,220,678 which is a division of 830,456 filed Sept. 6, 1977 abandoned which is a continuation-in-part of U.S. application 731,212, filed Oct. 12, 1976, now U.S. 4,136,216 which is a divisional application of U.S. application Ser. No. 607,506, filed Aug. 26, 1975 now U.S. Pat. No. 3,993,799 which is a continuation-in-part of U.S. application Ser. No. 512,224 filed Oct. 4, 1974, abandoned.

BACKGROUND OF THE INVENTION

Electroless or autocatalytic coating of dielectric surfaces is a well known process finding wide-spread utility in the preparation of such diverse articles as printed circuits, automotive trim, mirrors, etc.

Normal commercial electroless coating processes generally involve an initial cleaning and etching of the dielectric substrate by physical or chemical means to improve adherence of the metallic coating. The etched surface is then catalyzed by suitable catalytic compositions and processes to provide a surface capable of electroless plating initiation. In the prior art, the catalytic treatment generally encomposed the use of precious metals. More recently, compositions and processes utilizing non-precious metals have been disclosed suitable for electroless plating of dielectrics. U.S. Pat. Nos. 3,993,491, 3,993,799 and 3,958,048 which are included herein by reference disclose the prior art as well as the recent advancements in which non-precious metals have been reported.

In reviewing the teachings disclosed in U.S. Pat. Nos. 3,993,799 and 3,958,048 it is evident that colloids of either hydrous oxides, metals (elemental state) and alloys (phosphides, borides etc.) are useful in the catalytic treatment either as a two step or a single step activation treatment. Generally speaking, preferred metals in the above colloids are cobalt, copper, iron and nickel, although as suggested in U.S. Pat. No. 3,993,799 other non-precious metals may be used. It is recognized that it is generally desirable to have suspensions (dispersions) of very fine particulate matter for both stability (i.e., against precipitation), reactivity, and adhesion to the substrate. Accordingly, it is highly desirable to prepare such suspensions under conditions which would yield finely divided and highly stable colloids.

It was also recognized in U.S. Pat. No. 3,993,799 that those fine sized colloids of the metals and alloys due to their contact with water and/or air would react to provide a surface oxide. This type of problem has not been encountered in the prior art which has used precious metal colloids due to their inertness towards oxidation. It is recognized that if the surface of the colloids of metals or alloys is oxidized, the induction time would be prolonged when contacted with the electroless plating bath; that is true in particularly whenever a single stage activation step is carried forth. Accordingly, it is highly desirable to provide means by which the formation of surface oxide for the metals or alloys is eliminated or minimized. The present invention provides compositions and processes which improve upon these disadvantages.

It is also well recognized in the art of electroless plating that for effective electroless plating onto catalytically treated non-conductors at least one of the following requirements must be met:

Case I: The catalytic surface may react chemically with the reducing agents present within the electroless plating bath. More than one chemical reaction may take place.

Case II: The catalytic surface may react chemically with the metallic ions present within the electroless plating bath in a galvanic type replacement reaction.

In Case I, the chemical reactions may range from chemical reduction of the catalytic components present on the dielectric, and/or decomposition of the reducing agent at the interface ultimately yielding hydrogen gas via an active reducing agent intermediate. In Case II, to permit a galvanic replacement reaction, it is recognized that some of the metal ions present in solutions must be more noble with respect to the metal and metal ions present on the treated non-conductor surface. Such relationship is well recognized from the EMF series. Thus, while metals like copper, cobalt, nickel and iron may be preferred as recognized in U.S. Pat. No. 3,993,799, other non-precious metals may also be of potential use (e.g. zinc, manganese, aluminum, etc.)

SUMMARY OF THE INVENTION

It is the principle object of the present invention to provide an effective and economical process for preparing dielectric substrates for electroless coating or plating of a metallic surface thereon, and to provide an electroless coating process including such preparation.

It is a particular object of the present invention to provide improved compositions through which the catalytic activity would be maintained for a longer duration. Other objectives of the present invention, if not specifically set forth herein, will be apparent to the skilled artisan upon the reading of the detailed description of the invention which follows.

Surprisingly, it has been discovered that the aforesaid objectives may be achieved by a process and composition which render the colloidal composition more resistant to oxidation and hence provide a greater catalytic activity for the colloid when adsorbed onto the non-conductors, and in particular in a one stage activation treatment prior to the electroless plating step. The improved compositions incorporate mild reducing agents (antioxidant) which sacrificially oxidize in contact with air or oxygen and thereby extend the effectiveness of the catalyst.

DETAILED DESCRIPTION OF THE INVENTION

The process of the present invention is applicable to metallic plating of a wide variety of dielectric (non-conductor) substrates. Dielectric substrates described in the prior art, including thermoplastic and thermosetting resins and glass, may also be suitably plated in accordance with the present invention. Normally, these substrates will be cleaned and surface treated prior to plating in order to improve adherence of the metallic coating. The present invention is an improvement to the process and compositions disclosed in U.S. Pat. No. 3,993,799 which is included herein by reference as well as the process and compositions disclosed in U.S. Pat. No. 3,958,048.

The colloids of the present invention are generally prepared by adding the selected compound of a catalytic metal or a salt thereof; e.g. the sulfate, nitrate or acetate salt, to an aqueous medium to produce an aqueous solution reacting the above solution with a chemical agent which will yield by precipitation either a reduced metal, compound or an alloy of said metal. The precipitation reaction is generally carried forth in the presence of at least one colloid stabilizer thereby stabilizing the resulting colloid formed and insuring good dispersion for the medium.

Although there are various methods for the production of colloids in U.S. Pat. No. 2,438,230, such approaches, while simple to implement, do not provide a great freedom with respect to selectively of colloids formed and the properties as those produced by the precipitation technique. U.S. Pat. No. 3,635,668 describes a process for the production of copper hydrate suitable for use as a fungicide. U.S. Pat. No. 3,082,103 demonstrates a universal milling technique by which finely divided oxides may be formed. It should also be noted that while most of the examples in the present invention are directed to formation of the colloidal solution via precipitation techniques, the present invention is not limited to this approach. Specifically, catalytic colloidal composition may also be prepared by the dissolution and stabilization of properly prepared powders. Hence, the manner by which the chemical components are used in preparing said colloidal catalytic composition is a matter of convenience, e.g., shipping costs. The precipitation technique in producing the catalytic medium is believed however to possess certain advantages. Specifically, this technique is potentially capable of producing colloids of varied size, shape, and chemical make-up. This freedom is especially useful with respect to desired subsequent catalytic properties. Furthermore, such technique is also useful in the preparation of reduced metal or metal-alloys or compounds by adding a suitable precipitating agent (e.g. reducing agent), which can form the reduced metallic state or the alloys or the resulting compound(s) through its chemical interaction with the metal ions. Typical reducing agents are hydrazine, amineboranes, hypophosphites, borohydrides, sulfur type, etc. In the event that the colloids are prepared by a precipitation technique it may further be recommended that after centrifugation, washing and redispersion in pure water be undertaken thereby removing extraneous ionic species and ensuring a medium with low ionic strength. In use, it is also recommended that mild agitation (mechanical, gas dispersion and thermal) be applied to the solution composed of the colloidal particles. It is recognized that for storage and/or shipping the resulting colloids must show good stability. Accordingly, it is highly desirable to use preparation conditions in which highly stable colloids result.

The stability of the above colloidal compositions may be enhanced by various techniques, e.g., dialysis, repetitive centrifugation and washings, as well as by the addition of various materials, referred to herein as stabilizers. The term "stabilizer" is used herein to generally describe chemicals believed to be adsorbed onto the colloids thereby altering the charge characteristics of said colloids and thus preventing their coagulation. Such stabilizers may be of organic or inorganic nature.

Stabilizers contemplated by the present invention include secondary colloids, polyalcohols, sugars, dispersants and surfactants while, while by themselves do not serve to catalyze the dielectric substrate in this process, are believed to stabilize the active colloid by an encapsulation (or adsorption) mechanism. It is noted that for a specific composition more than one stabilizer may be present. Stabilizers may also be chemicals which take part within the colloidal double layer structure.

Typical secondary colloids are gum arabic, gelatin, agar agar, starch, albumin, hemoglobin, cellulose derivatives such as carboxymethyl cellulose and hydroxypropyl cellulose, N-alkylbetaaminopropionic acid, carboxymethyl dextran, and the like. Typical sugars include mannitol, sorbitol, dulcitol maltose, and arbinose raffinose.

Surfactants may also be suitably employed as a stabilizer for the hydrous oxide colloids. The surfactant, or surface active agent, as used herein generally refers to substances which are capable of lowering the surface tension of a liquid or the interfacial tension between two liquids. All such substances possess the common feature of a water-soluble (hydrophilic group attached to an organic (hydrophobic) chain. Surfactants as used herein are also intended to encompass detergents, dispersant and emulsifying agents regardless of whether they are or are not capable of lowering the interfacial surface tension. The surfactants used are not limited to the hydrocarbon type and they can be fluorocarbon or silicon bearing type.

It is also contemplated that a mixture of surfactants or surfactants with other stabilizers may be used. Care should be exercised (e.g. excess concentration) in the use of surfactants in the preparation of the present colloids, as would be noted by anyone skilled in the art.

The term "antioxidant" as used herein is generally intended to encompass chemical compounds which are mild reducing agents. These reducing agents, however, are not capable of reducing the metallic ions to the elemental state (e.g., $Ni^{+2}$ to $Ni°$). These reducing agents may or may not be colloid stabilizers. Typical antioxidants may be selected from compounds such as, but not limited to, alcohols, polyalcohols, hydroquinone, phenol, resorcinol, BHT, sugars, aldehydes, pyrogallol, cresol, BHA, sulfite, etc. The term "precipitation agent" as used herein is generally intended to encompass those chemical compounds which when contacted with metallic ions (with or without added energy) cause the onset of the secondary phase (insoluble phase). Typical materials may be reducing agents, hydroxides, sulphides and others. At times, depending on the chemical nature of the precipitation agents, codeposits within the resulting colloids are noted.

In general, the electroless coating process of the present invention comprises contacting, e.g., by immersion, the dielectric substrate, preferably previously etched with the colloid, i.e., the colloidal catalytic solution, washing the substrate with deionized water and then contacting the colloid adsorbed substrate with a composition comprising a reducing agent to form a discontinuous coating of the metal (or alloy) of the reduced oxidation state (or more active state) on the surface of the substrate, thus forming the catalytic nuclei active effective for the electroless build-up process upon subsequent immersion of the substrate in an appropriate electroless plating bath. Alternatively, the second step may be deleted.

More specifically, the improved process of the present invention is comprised of the following sequence of steps followed by electroless plating.

1. Immersing a dielectric substrate in a composition comprised of a colloid of a non-precious metal, preferably selected from the group consisting of copper, nickel, cobalt and mixtures thereof, and wherein the metal is either in the reduced state (elemental) or part of an alloy (e.g. phosphide, boride, nickel-copper, etc.).

2. Rinsing the substrate with water to remove excess colloid.
3. Immersing the substrate, after rinsing, in a composition comprised of a reducing agent capable of reducing or activating the surface portion of the adsorbed colloid to a lower (or an activated state about which the plating build-up takes place. The activation or reduction may be a separate step or be part of the electroless plating build-up. Activation may also encompass a selective dissolution of the colloidal stabilizer (a) when present on the substrate.

For the sake of convenience, certain examples hereinafter will not refer to the intermediate rinsing step, but the need for such step should be recognized.

The following examples are illustrative of the present invention and are not to be taken in limitation thereof.

EXAMPLE I

An ABS substrate was etched in a solution comprised of 400 g/l chromium oxide and 350 g/l concentrated sulfuric acid for several minutes at a temperature of 70° C. Thereafter, the etched substrate was immersed in a primer solution for five minutes, the primer (colloidal) composition being prepared by dissolving one gram of $NiCl_2.6H_2O$ in 100 milliliters of deionized water and raising the pH to 6.5 with the slow addition of one molar NaOH. The primed substrate was then rinsed and immersed in a reducing composition (developer) comprised of one g/l of $KBH_4$ for two minutes. The substrate was then rinsed and immersed in an electroless copper bath at a temperature of 40° C. having the following composition to effect plating:

| | |
|---|---|
| $CuSO_4 . 5H_2O$ | 15 g/l |
| EDTA (40%) | 68 cc/l |
| NaOH | 9 g/l |
| NaCN | 3 ppm |
| Tergitel TMN | 0.2 (wt. %) |
| $H_2CO$ (37%) | 22 c/l |

Substitution of other metallic compounds of catalytic metals for the nickel chloride should be obvious.

EXAMPLE II

A hydrous oxide colloid was prepared by adding five milliliters of 0.05 molar ammonium hydroxide to 20 milliliters of 0.25 molar copper acetate with good mixing. This colloid, when substituted for the colloid employed in Example I herein above, produced good electroless plating.

EXAMPLE III

An ABS substrate was prepared using the primer solution of Example II of U.S. Pat. No. 3,993,799, developed with the developer solution of Example I herein above. An electroless nickel plating was formed by immersion of the substrate at a temperature of 60° C. in an aqueous bath having the following composition:

| | |
|---|---|
| $NiSO_4 . 6H_2O$ | 25 g/l |
| $Na_4P_2O_7 . 10H_2O$ | 50 g/l |
| $NH_4OH$ (conc.) | 15 cc/l |
| Dimethylamine borane | 4 g/l |

EXAMPLE IV

One gram of $CoCL_2.6H_2O$ was dissolved in 100 ml of deionized water to which 0.5 ml of one molar NaOH was added. The suspension thus formed was heated for 24 hours at 65° C. and then additionally aged at room temperature for six days. Similar colloids were formed with 1.0 ml and 2.0 ml of NaOH being used.

EXAMPLE V

ABS substrates were immersed in the colloids of Example IV for five minutes at room temperature followed by rinsing and immersion in a developer solution containing 1 g/l $KBH_4$ at pH 8.5 for 2 to 5 minutes to reduce the cobalt or nickel to a lower oxidation state. Subsequent immersion of the plaques into an electroless copper bath at 40° C. produced plating in all instances.

EXAMPLE VI

An ABS substrate was immersed in a colloidal solution formed by adding to 1600 ml of 0.0125 molar copper acetate solution, 400 ml of 0.025 molar $NH_4OH$ dropwise with stirring of the solution. The substrate was thereafter developed and plated in the manner described in Example V with good results. Successful results were also achieved using a developer solution containing only 0.1 g/l $KBH_4$.

EXAMPLE VII

ABS substrates prepared in accordance with Example VI were successfully plated utilizing the following electroless nickel bath at pH 6 and a temperature of 25° C.:

| | |
|---|---|
| $Ni^{++}$ (from a sulfamate concentrate) | 8.0 g/l |
| Dimethylamine borane | 5.0 g/l |

EXAMPLE VIII

ABS substrates prepared in accordance with Example VI were also successfully plated utilizing the following electroless cobalt bath at pH 7.6 and 50° C.:

| | |
|---|---|
| $CoSO_4 . 7H_2O$ | 25 g/l |
| Disodium succinate $6H_2O$ | 25 g/l |
| Dimethylamine borane | 4 g/l |

EXAMPLE IX

The ABS substrate of Example VI was also successfully treated using the following developer solutions:
1. Borane-tertbutylamine complex (2 g/l) at 25° C. and 40° C. with immersion time of 5 minutes.
2. Borane morphine complex (2 g/l) at 25° C. and 40° C. with immersion time of 5 minutes.
3. Dimethylamine borane (2 g/l and pH 11 adjusted with NaOH) at 40° C. and immersion time of 5 minutes.

EXAMPLE X

Four hundred ml of 0.025 molar NH4OH was added dropwise with stirring to 1600 ml of 0.0125 molar copper acetate to form a colloidal primer solution from which other solutions were prepared and evaluated. The nature of certain surfactants added is shown in parenthesis. The process of evaluation consisted of ABS treatment in colloidal primer, developer at room temperature with a 1 g/l solution of KBH4 and coating with colloidal copper at 40° C. The following results were obtained:

| Solution | Additive | Conc. | Plating Evaluation after 5 days from Preparation of Control |
|---|---|---|---|
| 1 | NaCl | .01M | positive |
| 2 | NaCOOH | .01M | positive |
| 3 | Tartaric Acid | .01M | positive |
| 4 | Sucrose | .01M | positive |
| 5 | Sodium Lauryl Sulfate (anionic) | .01M | negative |
| 6 | K . Na tartrate | .01M | positive |
| 7 | Na citrate | .001M | negative |
| 8 | Union Carbide Tergitol 15-S-3 (nonionic) | 2ml/l | positive |
| 9 | DuPont Zonyl FSC (cationic) | 2ml/l | negative |
| 10 | Union Carbide - TMN surfactant (nonionic) | 2ml/l | positive |
| 11 | Zonyl FSA (anionic) | 2ml/l | positive |
| 12 | Zonyl FSB (amphoteric) | 2ml/l | negative |
| 13 | Zonyl FSN (nonionic) | 2ml/l | positive |
| 14 | Zonyl FSP (anionic) | 2ml/l | positive |
| 15 | 3M FC 170 (nonionic) | 2ml/l | positive |
| 16 | 3M FC 176 (nonionic) | 2ml/l | positive |
| 17 | none (control) | — | positive |
| 18 | control diluted 10 | — | positive |

It should be noted that the surfactants used in solutions 9 and 11-16 are all composed of fluorocarbon chains rather than hydrocarbon chains. Such surfactants have shown good chemical stability in a wide variety of chemical environments.

EXAMPLE XI

The control solution of Example X was also employed in coating of ABS substrates with the exception that the developer solution was diluted from 1 gr/l to 0.1 gr/l. Successful initiation of electroless plating was noted.

EXAMPLE XII

The control solutions of Example X were used in coating ABS substrates. The alkalinity of the electroless copper solution was varied, however, from 0.089 to 0.402 molar by the addition of sodium hydroxide. Improvement in the plating uniformity was noted as the alkalinity was increased, probably due to the increased reactivity of the electroless formulation.

EXAMPLE XIII

The procedure of Example X was followed with the exception that the following electroless copper formulation was used at 50° C.:

| | |
|---|---|
| $CuSO_4 \cdot 5H_2O$ | 10 gr/l |
| NaOH | 10 gr/l |
| Sodium potassium tartrate . $4H_2O$ | 50 gr/l |
| HCHO (37%) | 22 cc/l |

EXAMPLE XIV

Since surfactants are conventionally employed in electroless processes, the following surfactants were added to a 0.05% developer solution of potassium borohydride: Union Carbide Tergitol TMN and 15-S-3; DuPont Zenyl FSA, FSC and FSN; 3M FC-98, FC-128, FC-170, FC-134 and FC-176 in a concentration range of few mg/liter of developer solution. No major improvement in plating uniformity was noted.

EXAMPLE XV

The following colloidal solutions were prepared by first dissolving 1 gram of $NiCl_2.6H_2O$ in 100 ml DI water. In each case, a varied volume of 0.1 M NaOH was added slowly with agitation.

| Case No. | Volume of NaOH aded (ml) | Final pH |
|---|---|---|
| 1 | 0.4 | 6.6 |
| 2 | 1.0 | 7.0 |
| 3 | 2.0 | 7.2 |
| 4 | 5.0 | 7.3 |
| 5 | 10.0 | 7.4 |

These solutions were sealed and immersed at 65° C. for 48 hours. Evaluation of the colloidal solutions was undertaken following 43 hours at 65° C. and 3 days of storage at room temperature. The procedure used to evaluate was using standard ABS substrate, immersion in colloidal solution (10 minutes), rinse, immersion in developer (KBH4 1 g/l for 5 minutes), rinse, and electroless plating. Using the electroless copper at 40° C., induction time was slow and coverage was incomplete. using an electroless nickel of the following composition at 45° C., results showed improved coverage and a shorter induction time in comparison to the case of copper.

| | |
|---|---|
| $Ni^{++}$ (from a sulfamate conc.) | 8 g/l |
| DMAB | 5 g/l |
| pH | 5.3 |

The difference in the behavior between nickel and copper is probably due to the fact that in the case of copper the plating process is first dependent upon the successful galvanic reaction between the copper ions in solution and the reduced nickel on the surface.

EXAMPLE XVI

A copper colloid which initiated plating directly was prepared according to a procedure suggested by Weiser, "Inorganic Colloid Chemistry", Vol. 1, p. 137. In this preparation, 40 ml of 0.01 M $CuSO_4$ was heated to 80° C. 10 ml of 0.5% $H_3PO_2$ was added with stirring. Etched ABS substrates were immersed in the resulting colloid for 10 minutes, rinsed and directly immersed into the electroless copper solution of Example I at 45° C. Plating was noted to take place. Substitution of other catalytic metals for the $CuSO_4$, e.g. nickel sulfate, is anticipated to yield some alloy of nickel phosphide and metallic nickel.

EXAMPLE XVII

A colloidal nickel solution was prepared as follows: 25 ml of 0.005 M solution of potassium borohydride was added to a solution composed of 30 ml of 0.0025 M nickel acetate and 0.1 ml of CF-54 surfactant (product of Rohm & Haas). After immersion of the test substrate in the above priming solution, it was found useful to activate the surface by further immersion in a reducing agent solution (e.g., 1 g/l $KBH_4$). Immersion in the electroless copper bath resulted in good initiation and coverage. Substitution of other catalytic metals for nickel and/or mixtures thereof should be obvious upon reading this example. Moreover, it is recognized that other reducing agents may be used to yield the colloidal metals, compounds or alloys. The essential requirement for a reducing agent is to reduce homogeneously the metallic compound bearing the catalytic metal.

EXAMPLE XVIII

A negatively charged colloid of copper was prepared by the thermal aging (18 hours at 75° C.) of a solution composed of $1 \times 10^{-3}$ M $CuSO_4$, $2 \times 10^{-3}$ M NaOH and $4.0 \times 10^{-3}$ M sodium lauryl sulfate with a final pH of 9.8. Using ABS with the above procedure and compositions, no plating took place. While the dispersion was aged for 18 hours, shorter periods are possible as well.

EXAMPLE XIX

Colloidal catalytic hydrous oxides of copper and nickel were prepared by aging (18 hours at 75° C.) solutions composed of $9 \times 10^{-4}$ M $NiSO_4$, $1 \times 10^{-4}$ M $CuSO_4$, $2 \times 10^{-3}$ M NaOH and $4 \times 10^{-3}$ M of the cationic surfactant of Example XX of U.S. Pat. No. 3,993,799 with a final pH of 4.4. Using the above binary colloidal composition at 40° C. and a developer solution (1.5 g/l $KBH_4$, 5 minutes) with a commercial electroless copper bath (Sel-Rex Oxytron Cu #990) at 31° C. gave good plating results; however, using the single colloids under the same conditions did not produce as good quality plating coverage. It was also found that due to the apparent greater activity of the catalytic surface, reduced concentrations of developer solutions may be used in conjunction with the electroless copper of Example I. It is recognized that cobalt or iron may be substituted for nickel since they have a similar electronic structure. Based upon these results it is recognized that it is the catalytic surface composed of copper and nickel which offers a greater catalytic activity. In addition, it is also recognized that a mixed catalytic surface (i.e. copper and nickel, or copper and cobalt) may be derived from other mixed dispersions (metals, alloys and compounds). These catalytic metals when adsorbed enhance the catalytic activity of the surface. The actual concentrations for the mixed metals are best determined by simple trial experimentation.

EXAMPLE XX

Ferric and chromium hydrous oxide colloids were prepared by aging at 75° C. for 18 hours the following compositions: $1 \times 10^{-3}$ M $FeCl_3$, $2 \times 10^{-3}$ M NaOH and $4 \times 10^{-3}$ M of the cationic surfactant of Example XXV of U.S. Pat. No. 3,993,799 with a final pH=10.5; and $1 \times 10^{-3}$ M $Cr(NO_3)_3$, $2 \times 10^{-3}$ M NaOH and $4 \times 10^{-3}$ M surfactant with a final pH=4.2. These primer solutions used at 40° C. with 1.5 g/l $KBH_4$ and electroless copper bath (of Example I) at 40° C. showed some evidence of plating on ABS substrate, and it should be recognized that increasing the developer concentration, or the colloid concentration, or both, could also bring the conditions for plating to an optimum.

In the primer solution the ferric and chromium ions are adsorbed onto the substrate and then reduced to the zero oxidation state when immersed in the developer solution. After the developer solution, the substrate is immersed in the electroless copper bath. It is believed in this solution a replacement mechanism occurs in which the copper replaces the iron (or chromium) on the substrate (e.g. $Cu^{+2} + Fe° \rightarrow Cu°$) after which electroless initiation about the copper (Cu°) sites takes place. It is this replacement reaction which has been illustrated here in the previous example. It should be noted that this is only an example of the initiation mechanism and that any metal which will work for this mechanism falls within the contemplation of the present invention. Such metals are those having a more negative reduction potential than copper. Typical metals which fall into this category for use with electroless copper baths are iron, zinc and chromium.

Accordingly, any metallic nucleus which is more active with respect to copper ions or nickel ions contained within the electroless formulation could be a candidate with said metal nucleus derived from the adsorption of colloidal hydrous oxide and its reduction prior to the electroless plating step.

EXAMPLE XXI

Effective hydrous oxide copper colloids were prepared replacing sodium lauryl sulfate stabilizer of Example XXX of U.S. Pat. No. 3,993,799 with the addition singly of the following additives:

| | |
|---|---|
| Gum Arabic | 4 mg/l |
| Ethylene Glycol | 25 ml/l |
| Polyethylene Glycol (M.W. afterage 1000) | 0.025 molar |
| Tannic Acid | $5 \times 10^{-3}$ molar |
| Gylcerol | 25 ml/l |

It is noted that some of the additives used are mild reducing agents which are antioxidant.

In the practice of the present invention, an increase in the reactivity of the colloid has been found to permit a decrease in the reactivity of the reducing solutions. The latter may be modified by changes in the concentration of the reducing agent used and/or changing the nature of the agent used which may be part of the electroless bath. Methods for increasing colloidal reactivity may include concentration, temperature, particle size and charge modifications. The ability to use reducing solutions of lower reactivity is a significant cost savings and means for the use of less expensive reducing agents and/or electroless plating baths of greater stability.

The present invention is also effective in the formation of selective deposition on dielectric substrates, by selectively depositing such colloids.

In following the teaching disclosed in U.S. Pat. No. 3,958,048 which is included herein by reference, colloidal dispersions according to examples (of U.S. Pat. No. 3,958,048 VII and VIII) were prepared since they represented the best results. The resulting suspensions were tested in accordance with the process steps described in U.S. Pat. No. 3,958,048 using an alkaline electroless copper bath with formaldehyde as the reducing agent. Only the resulting suspension (dispersion) of example VIII (U.S. Pat. No. 3,958,048) yielded significant plating.

Within a few hours using the prepared catalytic suspension(s), plating results deteriorated drastically. However, a more interesting observation is that neither of the prepared suspensions was stable. Specifically, it was observed that within about 24 hours of preparation the colloidal nature of the suspension was destroyed, yielding a true solution or the formation of two distinct phases. In either case, it should be obvious that such unstable suspensions are not useful for commercial application.

However, these impractical compositions can be made useful, specifically in providing methods by which long term stability may be achieved. In the first method, energy (e.g., thermal) was added to one of the major reactants so that the precipitation reaction is carried forth above room temperature similarly to the heating described above. Repeating example VII of U.S. Pat. No. 3,958,048, the solution comprised of the inorganic salt(s) dispersant(s), (or colloid stabilizer(s)) was preheated to about 55° C. and then allowed to react with the precipitating agent (e.g., alkaline sodium borohydride). Results using this method clearly showed increased colloidal stability and simultaneously maintained the plating performance. While only one reactant was heated, it should be recognized that the method is applicable to either reactant, or both. Furthermore, for each system, a range of preferred temperatures is recognized; the value (or range) can be determined by simple experimentation by one skilled in the art using the present teachings.

Accordingly, it should be recognized that the present method in which external energy is supplied to the reaction (formation of the colloid) is extremely useful to the present process and composition. Furthermore, based upon these findings, the resulting colloids may be metallic, alloys, or compounds bearing metals which are catalytic for the electroless plating initiation. In addition, it should be recognized that any of several colloid stabilizers may be present during the precipitation reaction. Further, the end product formed (colloidal adduct) varies depending upon the nature of the precipitating agent and the metal ions present. The end product(s) may be metals, alloys, hydrous oxide and compounds and combinations thereof.

In the second method for improved stabilization, the following composition was utilized:

| | |
|---|---|
| $CuSO_4 \cdot 5H_2O$ | 9.96 g/l |
| $CoCl_2 \cdot 6H_2O$ | 2.38 g/l |
| Sodium lignosulfonate* | 12 g/l |
| $NaBH_4$ | 0.76 g/l |
| NaOH | variable |

*with some reducing sugars present

This admixture of chemicals was allowed to react with the end product of varied pH. End product pH values were in the range of about 6.5 to about 12.6. It is interesting to note that the resulting suspension(s) showed a major improvement in stability at higher pH values of above 9.5. In addition, it was found that prior to usage these suspensions having a higher pH value may be adjusted in pH(lowering) thereby becoming more effective in the plating process.

Accordingly, it should be recognized that the initial pH value for the prepared colloidal is a significant parameter reflecting the properties and the general stability of the resulting colloids. However, caution must be exercised in using over excessive pH values since hydroxyl ions may form soluble complexes with certain transition metal ions and destroy the colloidal nature of the suspension(s). While in this example sodium lignosulfenate was used as the stabilizer (dispersant), it is recognized that other suspending agents and stabilizers (e.g. derivatives of alkyl naphthalene, sulfonic acids, substituted benzoid alkyl sulfonic acids, and many others) can be substituted and employed in the method described. Further, while in this illustration sodium borohydride was selected as the precipitating agent, substitution of other precipitating agents should be obvious and their incorporation falls within the spirit of the present invention. It has been observed that the combination of copper and cobalt, or copper and nickel, provides a greater catalytic activity and, to a lesser extent, a combination of copper and iron.

Summarizing the results of the above illustrations, it is recognized that novel methods are available whereby improved stable dispersions useful in the preparation of colloidal catalytic compositions for non-conductive substrates prior to electroless metal deposition can be made.

It is also noted that in some of the above examples as well as some of the listed stabilizers, reference to amphoteric materials has been made. The incorporation of amphoteric stabilizers is extremely novel and useful in providing universal catalytic dispersions for multiplicity of substrates having varied plurality of surface charge. Specifically, since amphoteric stabilizers may be both negatively and positively charged with varied pH, the resulting catalytic dispersion may also be varied in the same manner. In fact, one skilled in the art may prepare one dispersion of a specific charge (utilizing an amphoteric product) and reverse the initial charge through a simple and rapid pH adjustment. Again, this novel feature is not limited to any specific colloid (metal vs. alloy vs. compound) or the steps used after the adsorption of the colloid on the substrate.

It should also be obvious that various approaches may be taken in the charging of such colloids, e.g., controlled addition of compound with specific anions such as hydroxyl ions and/or controlled addition of suitable surfactants and/or secondary colloids. In addition, the reference to catalytic metal is intended to encompass various colloidal end-products (e.g. metals, alloys, oxides and compounds) bearing the catalytic metal(s) in any of several oxidation states which are non-noble.

It will further be obvious to one skilled in the pertinent art that many modifications and variations may be made in the preceding description without departing from the spirit and scope of the present invention. For example, it will be apparent that mixtures of reducing agents may be used in a single solution or may be used in successive steps. Furthermore, it is within the scope of the present invention to delete the use of a separate reducing solution and directly immerse the substrate (contacted previously with the colloidal catalytic composition) in an electroless plating formulation containing one or more reducing agents.

As described above by way of examples, remarks, and cited references, a wide variety of chemical compounds may be selected as the precipitating agent(s). I have further found that certain precipitating agents (e.g., hydride derivatives such as sodium borohydride, dimethylamine borane and related ones) through their interaction with the catalytic metal ions yield finely divided colloids (black in appearance) which change in their appearance with time with noted detrimental effects upon the plating results. While I do not wish to be bound by theory, it appears that in the course of the colloidal formation, by-product(s) are also formed (e.g., $BH_4^-$ to $BO_2^-$) and it is the presence of such ionic by-product which, with time, is believed to react with the colloidal nucleus and cause the noted detrimental change. Accordingly, in selecting a precipitating agent, it is preferred to select a precipitating agent, the by-product(s) of which would not react and destroy the initial colloid(s) formed. Hydrazine and its derivatives is an example of one such class of precipitating agents whose by-products (nitrogen and hydrogen) do not accumulate along with the main desired reaction product(s) during the precipitating reaction.

Accordingly, I have recognized that the preferred precipitating agent(s) should be selected of such chemical nature which will either yield essentially no by-products accumulating to any degree with the colloid reaction by-product and which is detrimental to said colloidal nucleus, or those agents whose by-product(s) can stabilize said colloidal nucleus or be more inert in the resulting medium (e.g., $S_2O_4^{-1}$ and related compounds).

It should also be recognized by those skilled in the art that, from the present teachings, multiple combinations of materials shown in separate examples are possible and such combinations fall within the spirit of the invention.

I have further recognized that undesired by-products stemming from the precipitating agent(s) may be deactivated through their removal by any of several separation techniques (e.g., ion exchange, precipitations, dialysis, etc.) thereby removing their detrimental effect(s) on the produced colloids. Alternatively, a chemical agent may be incorporated which selectively would react with the formed by-products. One such example is the incorporation of magnesium or calcium ions with the $BO_2^-$ formed from various hydrides.

I claim:

1. A process for the electroless or chemical deposition of a non-conductor substrate which comprises
   (a) contacting said substrate with a colloidal dispersion of at least one non-precious catalytic metal capable of electroless metal initiation and wherein said colloidal dispersion is derived through the nucleation of a colloidal product with added thermal energy thereby improving the stability and effectiveness for said colloidal product, and
   (b) immersing the treated substrate into an electroless plating bath to deposit a metallic layer thereof.

2. The process according to claim 1 wherein said catalytic metal is copper.

3. The process according to claim 2 wherein said copper is in an elemental state.

4. The process according to claim 2 wherein said copper is part of an alloy.

5. The process according to claim 2 wherein said copper is part of an hydrous oxide.

6. The process according to claim 1 further containing the step of electroless metal deposition.

7. The process according to claim 1 further containing the step of etching of the substrate which is prior to the contacting of the substrate with the colloidal dispersion.

8. The process according to claim 1 further containing a colloid stabilizer.

9. The process according to claim 1 wherein the colloid of said colloidal dispersion was nucleated at a temperature above room temperature.

10. The process according to claim 1 wherein said colloidal dispersion was prepared by the dispersion of a powder in a solvent.

11. The process according to claim 1 wherein said colloidal dispersion is derived through a chemical reduction step of a compound bearing the catalytic metal.

12. The process according to claim 1 wherein said copper is part of a compound.

13. The process according to claim 1 further containing the step of activation and wherein said step of activation constitutes a selective dissolution of the colloid.

14. A process for the metallizing of a non-conductor substrate by electroless deposition comprising the steps:
   (a) immersing said substrate into an existing stable aqueous colloidal catalytic composition of an hydrous oxide colloid of a non-precious metal, said hydrous oxide colloid having been nucleated with the addition of thermal energy thereby improving the stability and effectiveness for said colloid,
   (b) rinsing said substrate to remove excess colloidal product, and
   (c) immersing the treated substrate into an electroless plating bath capable of being initiated by said hydrous oxide colloid or precursor thereof.

15. The process according to claim 14 wherein said electroless plating bath is copper.

16. The process according to claim 14 wherein said substrate is ABS.

17. The process according to claim 14 wherein said non-conductor substrate is a printed circuitry type substrate.

18. The process according to claim 17 wherein said substrate contains through-holes.

19. The process according to claim 14 wherein said electroless bath is operating above room temperature.

20. The process according to claim 14 wherein said hydrous oxide is copper which is in a reduced oxidation state.

21. The process according to claim 14 further containing the step of immersing said substrate in a reducing composition.

22. The process according to claim 14 wherein said colloidal catalytic composition is prepared by the suspension of a powder in a solvent, said powder comprising the colloidal catalytic product.

23. A process for the metallization of a printed circuitry substrate by electroless metal deposition comprising
   (a) immersing said substrate into an existing aqueous colloidal composition comprising colloids of a non-precious metal, said metal selected from the group consisting of copper, nickel, cobalt and iron and mixtures thereof, said colloidal catalytic composition having been prepared through the nucleation of the colloid by the addition of thermal energy thereby improving the stability and effectiveness for said colloidal product,
   (b) contacting the treated substrate with a reducing composition, and thereafter
   (c) immersing the treated substrate into an electroless plating bath capable of being initiated by said colloids or precursor thereof.

24. The process according to claim 23 wherein said reducing agent in amineborane.

25. The process according to claim 23 wherein said reducing agent is hydrazine.

26. The process according to claim 23 wherein said printed circuitry substrate contains through-holes.

27. The process according to claim 23 wherein said electroless plating bath is operating above room temperature.

* * * * *